(12) United States Patent
Chu

(10) Patent No.: US 8,897,092 B2
(45) Date of Patent: Nov. 25, 2014

(54) MEMORY STORAGE DEVICE, MEMORY CONTROLLER AND CONTROLLING METHOD

(75) Inventor: Chien-Hua Chu, Hsinchu County (TW)

(73) Assignee: Phison Electronics Corp., Miaoli (TW)

( * ) Notice: Subject to any disclaimer, the term of this patent is extended or adjusted under 35 U.S.C. 154(b) by 469 days.

(21) Appl. No.: 13/425,425

(22) Filed: Mar. 21, 2012

(65) Prior Publication Data

US 2013/0166934 A1 Jun. 27, 2013

(30) Foreign Application Priority Data

Dec. 23, 2011 (TW) .............................. 100148314 A

(51) Int. Cl.
*G11C 5/14* (2006.01)
(52) U.S. Cl.
USPC ....................... 365/227; 365/189.07; 365/229
(58) Field of Classification Search
CPC ........... G11C 16/30; G11C 2029/5004; G11C 29/50004; G11C 8/10
USPC ..................... 365/227, 189.07, 229
See application file for complete search history.

(56) References Cited

U.S. PATENT DOCUMENTS

| | | | | |
|---|---|---|---|---|
| 5,815,440 A | * | 9/1998 | Akaogi et al. | ............ 365/185.24 |
| 6,144,578 A | * | 11/2000 | Nishimura | ..................... 365/145 |
| 2003/0198083 A1 | * | 10/2003 | Akaogi et al. | ............ 365/185.09 |
| 2013/0336067 A1 | * | 12/2013 | Tanaka et al. | ............ 365/185.18 |

* cited by examiner

*Primary Examiner* — Tuan T Nguyen
(74) *Attorney, Agent, or Firm* — Jianq Chyun IP Office

(57) ABSTRACT

A controlling method for a memory storage device is provided. The method includes: disposing a rewriteable non-volatile memory module which is operated at a first working voltage in the memory storage device; and detecting whether the first working voltage is lower than a first voltage threshold. The method also includes: detecting whether a circuit component working voltage is lower than a circuit component voltage threshold; when the first working voltage is lower than the first voltage threshold, setting the memory storage device to stop executing commands from a host system and to stop giving commands to the rewriteable non-volatile memory module; and, when the circuit component working voltage is lower than the circuit component voltage threshold, enabling a reset signal to stop receiving and executing commands from the host system. Therefore, the method can effectively improve the stability of the memory storage device.

25 Claims, 6 Drawing Sheets

US 8,897,092 B2

MEMORY STORAGE DEVICE, MEMORY CONTROLLER AND CONTROLLING METHOD

CROSS-REFERENCE TO RELATED APPLICATION

This application claims the priority benefit of Taiwan application serial no. 100148314, filed on Dec. 23, 2011. The entirety of the above-mentioned patent application is hereby incorporated by reference herein and made a part of this specification.

BACKGROUND

1. Technique Field

The present invention relates to a memory storage device, and more particularly, to a memory storage device capable of setting a corresponding operation mode according to a working voltage, and a memory controller and a controlling method thereof.

2. Description of Related Art

Along with the widespread of digital cameras, cell phones, and MP3 in recently years, the consumers' demand to storage media has increased drastically. Since a rewritable non-volatile memory has several characteristics such as non-volatility of data, low power consumption, small size, non-mechanical structure, and fast reading and writing speed, the rewritable non-volatile memory is the most suitable memory applied in a portable electronic product, e.g., a laptop. A solid state drive is a memory storage device adopting a flash memory as a storage medium. For these reasons, flash memory has become a very popular part of the electronic industry in recent years.

A memory storage device includes a plurality of elements, and each element is operated under a different working voltage from others. If a working voltage of an element is lower than a voltage threshold, the element is unable to work normally. To maintain the normal operation of the memory storage device, in general, the memory storage device is reset when a working voltage for the controller in the memory storage device is lower than a corresponding voltage threshold. However, when the power of the memory storage device is unstable temporarily, some of the elements work normally, but some of the elements are unable to work. For example, with a certain power supply, the buffer of the memory storage device can work normally, but the rewritable non-volatile memory is unable to work normally. At this moment, if the memory storage device is reset, data in the buffer will be lost. Therefore, how to design a memory storage device and a related controlling method in order to avoid the data lost of the memory due to unstable power source is the main topic for the people skilled in this art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY OF THE INVENTION

A memory storage device, a memory controller and a controlling method are provided in the present invention, wherein the operation mode of the memory storage device can be controlled according to the different working voltages so as to avoid the data lost.

According to an exemplary embodiment of the present invention, a memory storage device including a connector, a voltage detection circuit, a rewritable non-volatile memory module and a memory controller is provided. Herein, the connector is configured to couple with the host system. The voltage detection circuit is configured to receive an input voltage and provide a first working voltage and a circuit component working voltage. The voltage detection circuit includes a first voltage detector and a circuit component voltage detector, wherein the first voltage detector is configured to detect whether the first working voltage is lower than a first voltage threshold and the circuit component voltage detector is configured to detect whether the circuit component working voltage is lower than a circuit component voltage threshold. The rewritable non-volatile memory module is coupled to the voltage detection circuit and operated at the first working voltage. The memory controller is coupled to the voltage detection circuit. When the first working voltage is lower than the first voltage threshold, the voltage detection circuit transmits a first signal to the memory controller, and the memory controller enters a power saving mode in response to the first signal, wherein the memory controller stops executing an command from the host system and stops giving an command to the rewritable non-volatile memory module in the power saving mode. When the circuit component working voltage is lower than the circuit component voltage threshold, the voltage detection circuit enables a reset signal, which leads the memory controller failed to receive and execute the command from the host system.

From another perspective, according to an exemplary embodiment of the present invention, a memory controller for a memory storage device having a rewritable non-volatile memory module is provided. The above-mentioned memory controller includes a host interface, a memory interface and a memory management circuit. The host interface is configured to be coupled to a host system. The memory interface is configured to be coupled to the rewritable non-volatile memory module. The memory management circuit coupled to the host interface and the memory interface is configured to receive the first signal and enter a power saving mode in response to the first signal. In the power saving mode, the memory controller stops executing a command from the host system and stops giving a command to the rewritable non-volatile memory module. The above-mentioned rewritable non-volatile memory module is operated at the first working voltage, and the first signal is transmitted to the memory management circuit if the first working voltage is lower than the first voltage threshold. In addition, the memory management circuit detects whether the reset signal is enabled, and the memory management circuit is failed to receive and execute a command from the host system when the reset signal is enabled. As the circuit component working voltage is lower than the circuit component voltage threshold, the reset signal is enabled.

From another perspective, according to an exemplary embodiment of the present invention, a controlling method employed by a memory storage device is provided. The controlling method includes disposing the rewritable non-volatile storage device in the memory storage device, setting the rewritable non-volatile storage device to work at the first working voltage, and detecting whether the first working voltage is lower than the first voltage threshold. The above-mentioned controlling method further includes detecting whether the circuit component working voltage is lower than the circuit component voltage threshold, setting the memory storage device to enter the power saving mode in order to stop executing a command from the host system and giving a command to the rewritable non-volatile memory module if the first working voltage is lower than the first voltage threshold, and enabling the reset signal in order to stop receiving and executing a command from the host system if the circuit component working voltage is lower than the circuit component voltage threshold.

In summary, the memory storage device, the memory controller and the controlling method provided by the exemplary embodiments can avoid the data lost of the buffer effectively when the supply voltage is unstable and can execute the incomplete command again when the supply voltage is stable.

It should be understood, however, that this Summary may not contain all of the aspects and embodiments of the present invention, is not meant to be limiting or restrictive in any manner, and that the invention as disclosed herein is arid will be understood by those of ordinary skill in the art to encompass obvious improvements and modifications thereto.

In order to make the aforementioned and other features and advantages of the invention more comprehensible, embodiments accompanying figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1A:
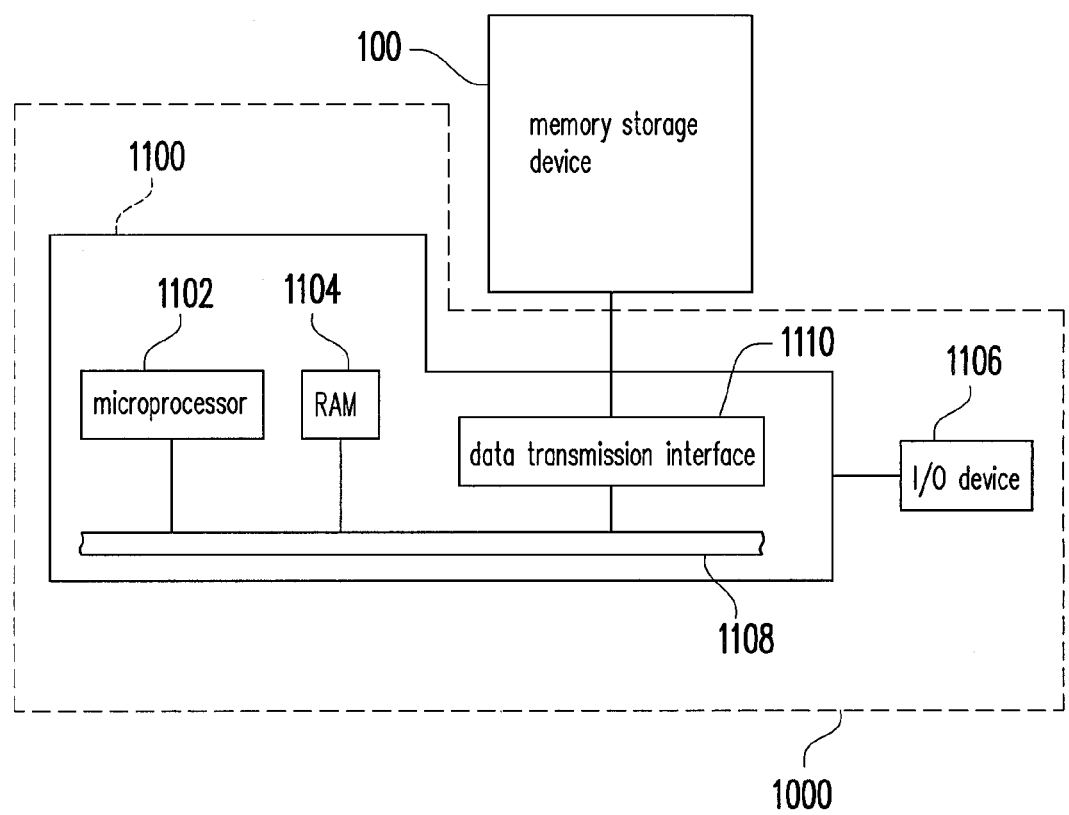
FIG. 1A is a diagram of a host system and a memory storage device according to a first exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together or A, B and C together.

It is to be noted that the term "a" or "an" entity refers to one or more of that entity. As such, the terms "a" (or "an"), "one or more" and "at least one" can be used interchangeably herein.

First Exemplary Embodiment

Generally speaking, a memory storage device (or a memory storage system) includes a rewritable non-volatile memory module and a controller (or a control circuit). The memory storage device is usually used together with a host system so that the host system can write the data into or read the data from the memory storage device.

FIG. 1A is a diagram of a host system and a memory storage device according to a first exemplary embodiment of the present invention.

Figure 1B:
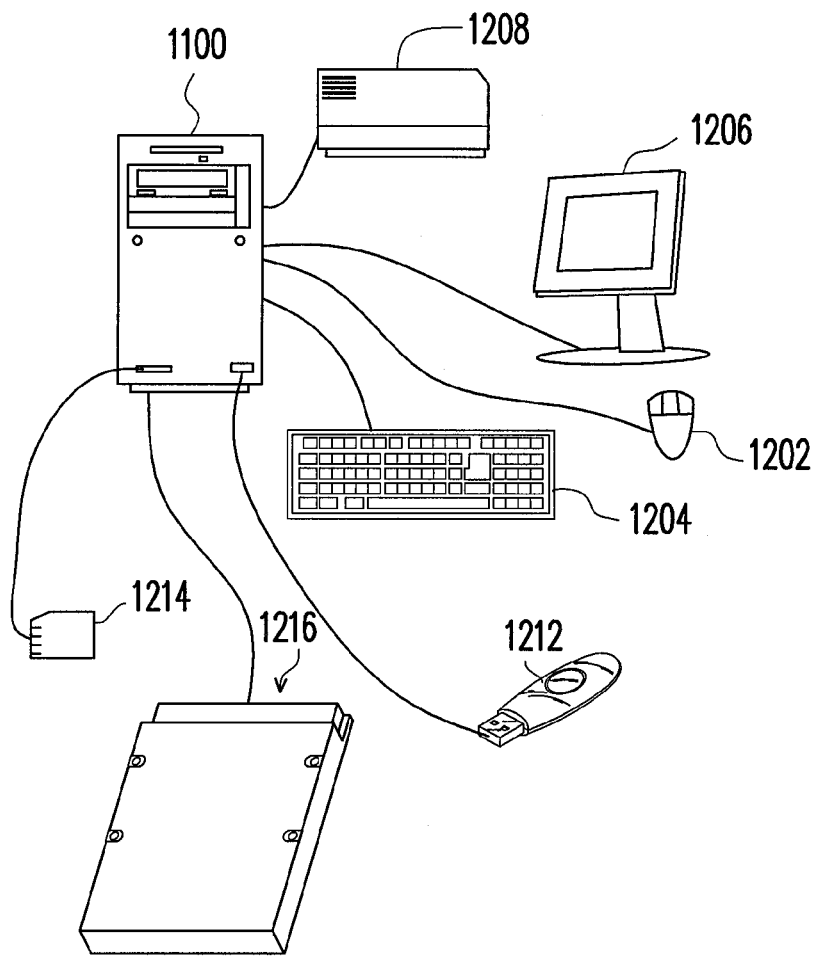
FIG. 1B is a diagram of a computer, an input/output device, and a memory storage device according to the first exemplary embodiment of the present invention.

Referring to FIG. 1A, a host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106, for example, includes a mouse 1202, a keyboard 1204, a display 1206 and a printer 1208 as shown in FIG. 1B. It should be understood that the devices illustrated in FIG. 1B are not intended to limit the I/O device 1106, and the I/O device 1106 may further include other devices.

In the present exemplary embodiment of the invention, the memory storage device 100 is coupled to other components of the host system 1000 through the data transmission interface 1110. By using the microprocessor 1102, the RAM 1104, and the I/O device 1106, the data can be written into or read from the memory storage apparatus 100. The memory storage device 100 is, for example, a flash drive 1212, a memory card 1214, or a solid state drive (SSD) 1216 as shown in FIG. 1B.

Figure 1C:
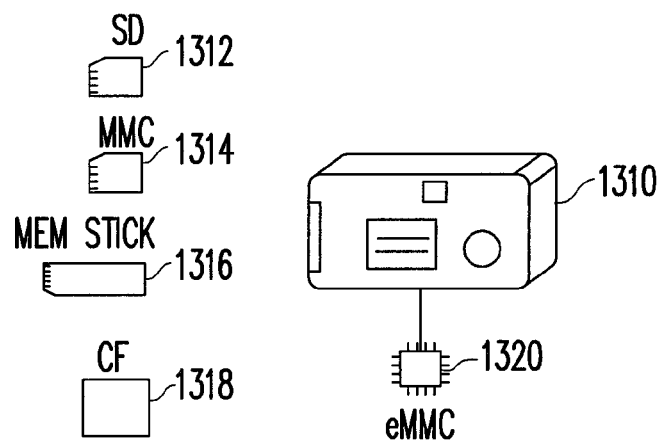
FIG. 1C is a diagram of a host system and a memory storage device according to the first exemplary embodiment of the present invention.

Generally speaking, the host system 1000 may be any system which can be substantially implemented with the memory storage device 100 for storing data. Even though the host system 1000 is described as a computer system in the present exemplary embodiment, in another exemplary embodiment of the present invention, the host system 1000 may be a digital camera, a video camera, a telecommunication device, an audio player, or a video player. For example, if the host system is a digital camera (video camera) 1310, the rewritable non-volatile memory storage device is then a SD card 1312, a MMC card 1314, a memory stick 1316, a CF card 1318 or an embedded storage device 1320 (as shown in FIG. 1C) applied in the host system. The embedded storage device 1320 includes an Embedded MMC (eMMC). It should be mentioned that the eMMC is directly coupled to a substrate of the host system.

Figure 2:
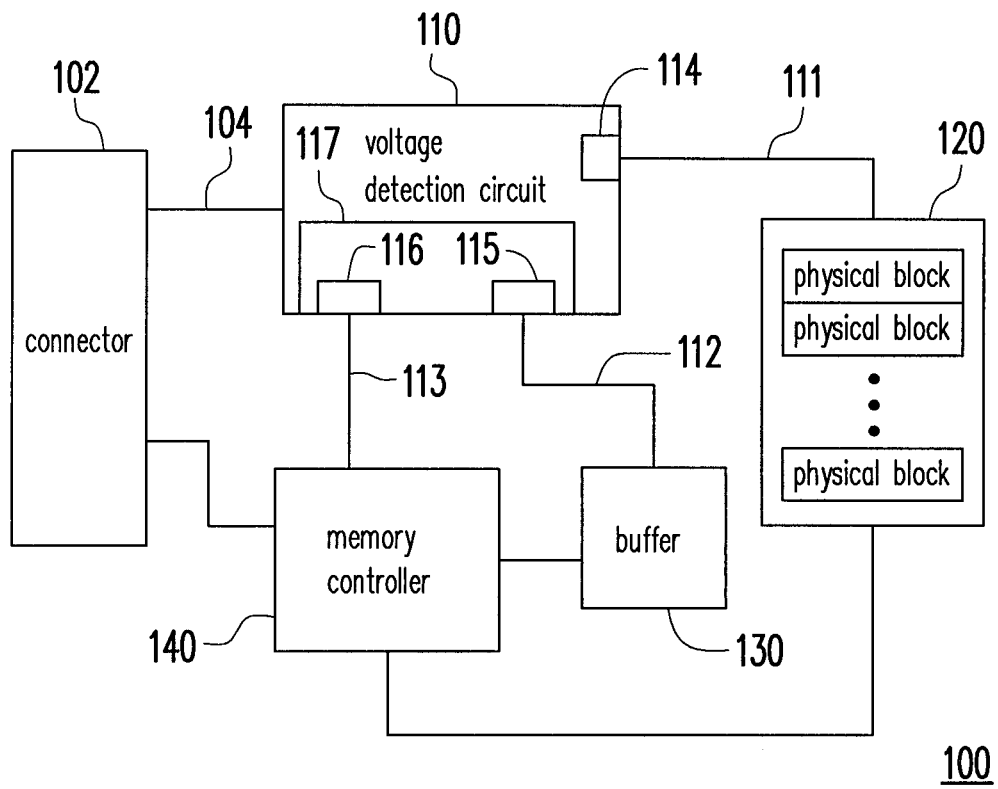
FIG. 2 is a schematic block diagram of a memory storage device illustrating in FIG. 1A.

FIG. 2 is a schematic block diagram of the memory storage device illustrating in FIG. 1A.

Referring to the FIG. 2, the memory storage device 100 includes a connector 102, a voltage detection circuit 110, a rewritable non-volatile memory module 120, a buffer 130 and a memory controller 140.

The connector 102 is configured to be coupled to a host system 1000. In the present exemplary embodiment, the connector 102 is compatible with the serial advanced technology attachment (SATA) standard. However, It should be understood that the present invention is not limited thereto, and the connector 102 may also be compatible with a Parallel Advanced Technology Attachment (PATA) standard, an Institute of Electrical and Electronic Engineers (IEEE) 1394 standard, a peripheral component interconnect express (PCI Express) standard, a universal serial bus (USB) connector, a secure digital (SD) standard, a memory stick (MS) standard, a multi media card (MMC) standard, a compact flash (CF) standard, an integrated device electronics (IDE) standard, or other suitable standards.

The voltage detection circuit 110 is coupled to the connector 102 for receiving an input voltage 104 and providing a first working voltage 111, a second working voltage 112 and a third working voltage 113. The voltage detection circuit 110 includes a circuit component voltage detector 117 and a first voltage detector 114. The first voltage detector 114 is configured to detect whether the first working voltage 111 is lower than a first voltage threshold. The circuit component voltage detector 117 is configured to detect whether a circuit component working voltage is lower than a circuit component voltage threshold. If the circuit component working voltage is lower than the circuit component voltage threshold, it is determined that the working voltage of a key circuit component in the memory storage device 100 is too low, which leads to the abnormal operation of the memory storage device 100. In the present exemplary embodiment, the circuit component voltage detector 117 includes a second voltage detector 115 and a third voltage detector 116. The second voltage detector 115 is configured to detect whether the second working voltage 112 is lower than a second voltage threshold, and a buffer 130 is operated at the second working voltage 112. And, the third voltage detector 116 is configured to detect whether the third working voltage 113 is lower than a third voltage threshold, and the memory controller 140 is operated at the third working voltage 113. In the present exemplary embodiment, the above circuit component working voltage is the second working voltage 112, and the above circuit component voltage threshold is the second voltage threshold.

For example, in the present exemplary embodiment, the first voltage threshold is bigger than the second voltage threshold, and the second voltage threshold is bigger than the third voltage threshold. In one exemplary embodiment, the first voltage threshold might be in a range of 3.3 volts to 2.1 volts, the second voltage threshold might be in a range of 2.1 volts to 1.3 volts and the third voltage threshold might be in a range of 1.3 volts to 0.5 volts. To be specific, in another exemplary embodiment, the first voltage threshold is 2.7 volts, the second voltage threshold is 1.8 volts and the third voltage threshold is 1.0 volts. It should be understood that, the present invention is not limited thereto. In another embodiment of the present invention, the first voltage threshold, the second voltage threshold and the third voltage threshold can be set as other appropriate values.

Especially, in the present exemplary embodiment, the voltage detection circuit 100 transmits the first signal, enables the rest signal or transmits the second signal according to the detecting result of the first voltage detector 114, the second voltage detector 115 and the third voltage detector 116. The operations of transmitting the first signal, enabling the reset signal or transmitting the second signal are described in detail below.

The rewritable non-volatile memory module 120 is coupled to the voltage detection circuit 110, and is configured to store data written by the host system 1000. The rewritable non-volatile memory module 120 includes a plurality of physical blocks. Each of the physical blocks includes a plurality of physical pages, and each of the physical pages includes at least one physical sector, wherein the physical pages which belongs to the same physical block can be written separately but must be erased together. Furthermore, the physical block is the minimum unit for erasing. That is to say, each of the physical blocks has a minimum number of memory cells for being erased altogether. On the other hand, the physical page is the minimum unit for programming. Especially, the rewritable non-volatile memory module 120 is operated at the first working voltage 111, and the rewritable non-volatile memory module 120 is unable to work normally when the first working voltage 111 is lower than the first voltage threshold.

In the present exemplary embodiment, the rewritable non-volatile memory module 120 is a Multi Level Cell (MLC) NAND flash memory module. However, the present invention is not limited thereto. The rewritable non-volatile memory module 120 can be a Single Level Cell (SLC) NAND flash memory module, other flash memory modules or other memory modules with the same property.

The buffer 130 is coupled to the voltage detection circuit 110 and used for temporarily storing any data. For example, the buffer 130 is a dynamic random access memory (DRAM). In the other embodiments, the buffer 130 is a static random access memory (SRAM). Especially, the buffer 130 is operated at the second working voltage 112, and the buffer 130 is unable to work normally when the second working voltage 112 is lower than the second voltage threshold.

The memory controller 140 is coupled to the connector 102, the voltage detection circuit 110, the rewritable non-volatile memory module 120 and the buffer 130. The memory controller 140 executes a plurality of logic gates or control instructions which are implemented in a hardware form or in a firmware form as well as performs operations such as writing, reading or erasing the data in the rewritable non-volatile memory module 120 according to commands from the host system 1000. The memory controller 140 is configured for receiving the signal from the voltage detection circuit 110 and entering the different modes in response to the received signal. Especially, the memory controller 140 is operated at the third working voltage 113, and the memory controller 140 is unable to work normally when the third working voltage 113 is lower than the third voltage threshold.

Figure 3:
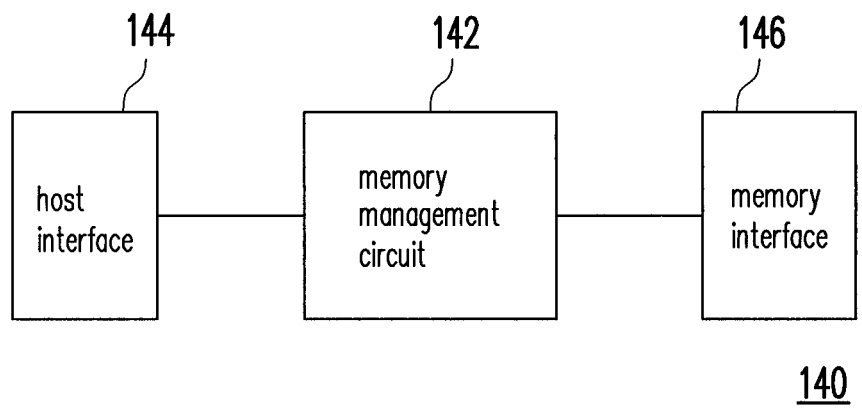
FIG. 3 is a schematic block diagram of a memory controller illustrating in the first exemplary embodiment of the present invention.

FIG. 3 is a schematic block diagram of the memory controller illustrating in the first exemplary embodiment of the present invention.

Referring to the FIG. 3, the memory controller 140 includes a memory management circuit 142, a host interface 144 and a memory interface 146.

The memory management circuit 142 is configured for controlling the whole operation of the memory controller 140. To be more specific, the memory management circuit 142 includes a plurality of the control instructions which are executed for data writing, reading and erasing when the memory storage device 100 is operated.

In the present exemplary embodiment, the control instructions in the memory management circuit 142 are implemented in a firmware form. For example, the memory management circuit 142 includes a microprocessor unit (not shown) and a read only memory (ROM, not shown), and these control commands are burned into the read-only memory. When the memory storage device 100 is operated, the control instructions are executed by the microprocessor unit in order to perform the operations such as data writing, data reading and data erasing.

In another exemplary embodiment of the present invention, the control instructions of the memory management circuit 142 may also be stored in a specific block (for example, the system block in a memory module exclusively used for storing system data) of the rewritable non-volatile memory module 120 as the programming codes. Also, the memory management circuit 142 includes a microprocessor unit (not shown), a read only memory (ROM, not shown) and a random access memory (not shown). Especially, the read only memory includes a driving code which is executed by the microprocessor before downloading the control instructions stored in the rewritable non-volatile memory module 120 into the random access memory of the memory management circuit 142 when the memory controller 140 is activated. Afterwards, the microprocessor unit employs the control instructions for data writing, reading and erasing. Furthermore, in another exemplary embodiment of the present invention, the control instructions of the memory management circuit 142 can be implemented in a hardware form.

The host interface 144 is coupled to the memory management circuit 142 and configured to receive and identify commands given and data transmitted by the host system 1000. In other words, the commands and the data transmitted by the host system 1000 are passed to the memory management circuit 142 through the host interface 144. In the present exemplary embodiment, the host interface 144 is compatible with the SATA standard. However, the present invention is not limited thereto, and the host interface 144 may also be compatible with a PATA standard, an IEEE 1394 standard, a PCI Express standard, an USB standard, a SD standard, a MS standard, a MMC standard, a CF standard, an IDE standard, or other suitable types of data transmission standards.

The memory interface 146 is coupled to the memory management circuit 142 for accessing the rewritable non-volatile memory module 120. In other words, the data desired to be written to the rewritable non-volatile memory module 120 is converted to an acceptable format for the rewritable non-volatile memory module 120 by the memory interface 146.

In the present exemplary embodiment, the memory management circuit 142 enters the different modes according to the first signal and the second signal transmitted by the voltage detection circuit 110 or according to whether the reset signal is enabled. Referring to the FIG. 2 again, under normal circumstances, if the first working voltage 111 is higher than the first voltage threshold, the second working voltage 112 is higher than the second voltage threshold and the third working voltage 113 is higher than the third voltage threshold, the memory controller maintains the normal operation mode. To be more specific, while in the normal operation mode, the memory controller 140 receives commands from the host system 1000 and accesses the rewritable non-volatile memory module 120 according to the commands. For example, the memory controller 140 receives a write command from the host system 1000 and writes data into the rewritable non-volatile memory module 120 according to the write command However, if the first voltage detector 1140 detects that the first working voltage 111 is lower than the first voltage threshold, the voltage detection circuit 100 transmits the first signal to the memory controller 140. Specially, the memory management circuit 142 enters the power saving mode after receiving the first signal. Specifically, in the power saving mode, the memory management circuit 142 stops executing commands from the host system 1000 and stops giving commands to the rewritable non-volatile memory module 120. In the example which the connector 102 is compatible with the SATA standard, before the host system 1000 giving the access command to the memory storage device 100, a X_RDY signal is transmitted to the memory storage device 100 for querying whether the memory storage device 100 is free to receive the access command. If the memory storage device 100 is free to receive the access command, a R_RDY signal is replied. Otherwise, a SYNC signal is replied. In the present exemplary embodiment, if the memory controller 140 is in the power saving mode, the memory management circuit 142 replies the SYNC signal to the host system 1000 in response to the received X_RDY signal in order to indicate the memory storage device 100 is unable to execute the access command. The meaning of replying the SYNC signal from the memory management circuit 142 is to postpone the time of replying the R_RDY signal. Once the host system 1000 receives the R_RDY signal, the host system 1000 then regards the rewritable non-volatile memory module 120 is ready for executing the data accessing operation. Namely, since the first working voltage 111 is lower than the first voltage threshold (for example, 2.7 volts), the rewritable non-volatile memory module 120 is unable to work normally, so the memory controller 140 temporarily stops accessing the rewritable non-volatile memory module 120. Also, the currently executing command by the rewritable non-volatile memory module 120 is interrupted, too. For example, if the memory controller 140 enters the power saving mode during the time that the write command is executed by the rewritable non-volatile memory module 120, the operation of executing the write command by the rewritable non-volatile memory module 120 is interrupted. It should be noted that, at this time, the write data corresponding to the write command is still stored in the buffer 130 and in the power saving mode, the buffer 130 and the memory controller 140 are still operated normally.

However, if the memory controller 140 is in the power saving mode, and the first voltage detector 140 detects that the first working voltage 110 is raised and is higher than the first voltage threshold, the voltage detection circuit 110 transmits the second signal to the memory controller 140. After receiving the second signal, the memory management circuit 142 enters the normal operation mode again in response to the second signal. In other words, after re-entering the normal operation mode, the memory controller 140 receives commands from the host system 1000 again and accesses to the rewritable non-volatile memory module 120 according to the received commands.

Especially, in the present exemplary embodiment, after the memory controller 140 re-entering the normal operation mode, the memory management circuit 142 executes the command which is interrupted because of entering the power saving mode to the rewritable non-volatile memory module 120 again.

For example, assuming that the memory controller 140 executes the write command to the rewritable non-volatile memory module 120 before entering the power saving mode, wherein the write data corresponding to the write command is still stored in the buffer 130. After the memory controller re-entering the normal operation mode, the memory management circuit 142 selects a physical block from the rewritable non-volatile memory module 120, reads the write data corresponding to the incomplete write command from the buffer 130 and writes the write data into the physical block which is newly selected. However, in other embodiments, after re-entering the normal operation mode, the memory controller 140 writes the write data corresponding to the above-mentioned write command into a following physical page of an old block, where the old block is the physical block where the above write command is executed before entering the power saving mode. In another embodiment, after re-entering the normal operation mode, the memory controller 140 writes a portion of the write data corresponding to the above write command into the newly selected physical block and writes the other portion of the write data into the above-mentioned old block. The present invention is not limited thereto.

Figure 4A:
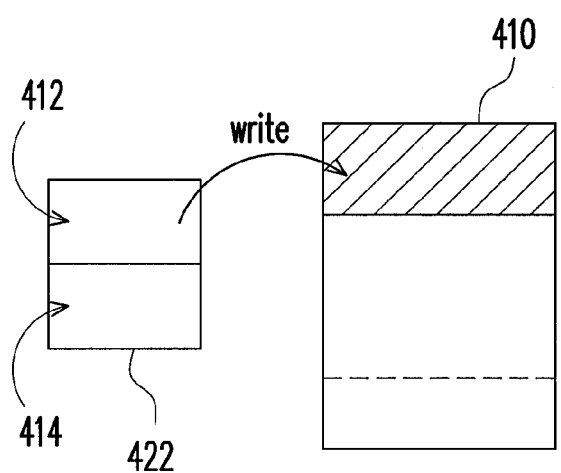
FIG. 4A and FIG. 4B are schematic diagrams of executing the write command after re-entering the normal operation mode described in the first exemplary embodiment.
Figure 4B:
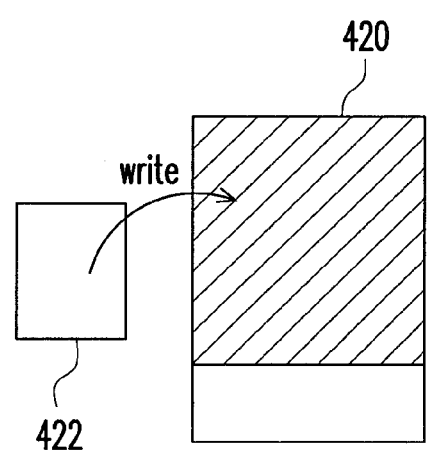

FIG. 4A and FIG. 4B are schematic diagrams of executing the write command after re-entering the normal operation mode described in the first exemplary embodiment.

Referring to FIG. 4A, during the period of executing the write command by the memory management circuit 142, the memory controller 140 enters the power saving mode according to the first signal, wherein a first portion of the write data 412 corresponding to the write command has been written into the physical block 410 but a second portion of the write data 414 has not been written into the physical block 410.

Referring to the FIG. 4B, in the power saving mode, the buffer 130 is still operated, so the write data 422 is temporarily stored into the buffer 130 without data loss. Therefore, after the memory controller 140 receiving the second signal and re-entering the normal operation mode, the memory management circuit 142 reads the write data 422 from the buffer 130, and the write data 422 is written into the newly selected physical block 420.

In more detail, the physical page of the physical block of the rewritable non-volatile memory module 120 can be only programmed once, and the erase command has to be executed before the second time programming of the physical page. In addition, if an ending of the first portion of the write data 412 is written into a partial physical page, after the memory controller 140 re-entering the normal operation mode, the second portion of the write data 414 is unable to be written into the physical page where a partial physical page has already been occupied. In the present exemplary embodiment, the memory management circuit 142 selects another empty physical block, and writes the write data into the newly selected physical block in order to execute the write command again.

Furthermore, if the memory controller 140 executes the read command to the rewritable non-volatile memory module 120 before entering the power saving mode, the memory management circuit 142 reads the data corresponding to the read command from the rewritable non-volatile memory module 120 again after the memory controller 140 re-entering the normal operation mode. Moreover, if the memory controller 140 executes the erase command to the rewritable non-volatile memory module 120 before entering the power saving mode, the memory management circuit 142 gives the erase command to the rewritable non-volatile memory module 120 again after the memory controller 140 re-entering the normal operation mode.

As shown in FIG. 2, in the present exemplary embodiment, if the second voltage detector 115 detects that the second working voltage 112 is lower than the second voltage threshold or the third voltage detector 116 detects that the third working voltage 113 is lower than the third voltage threshold, the voltage detection circuit 110 enables the reset signal. After enabling the reset signal, the memory controller 113 is unable to receive and execute commands from the host system 1000. To be more specific, during the enabling period of the reset signal, the coupling between the host system 1000 and the memory storage device 100 is interrupted. In addition, the host system 1000 is coupled to the memory storage device 100 again, and the power is supplied from the host system 1000 to the memory storage device through the connector 102 since the reset signal is disabled.

Figure 5:
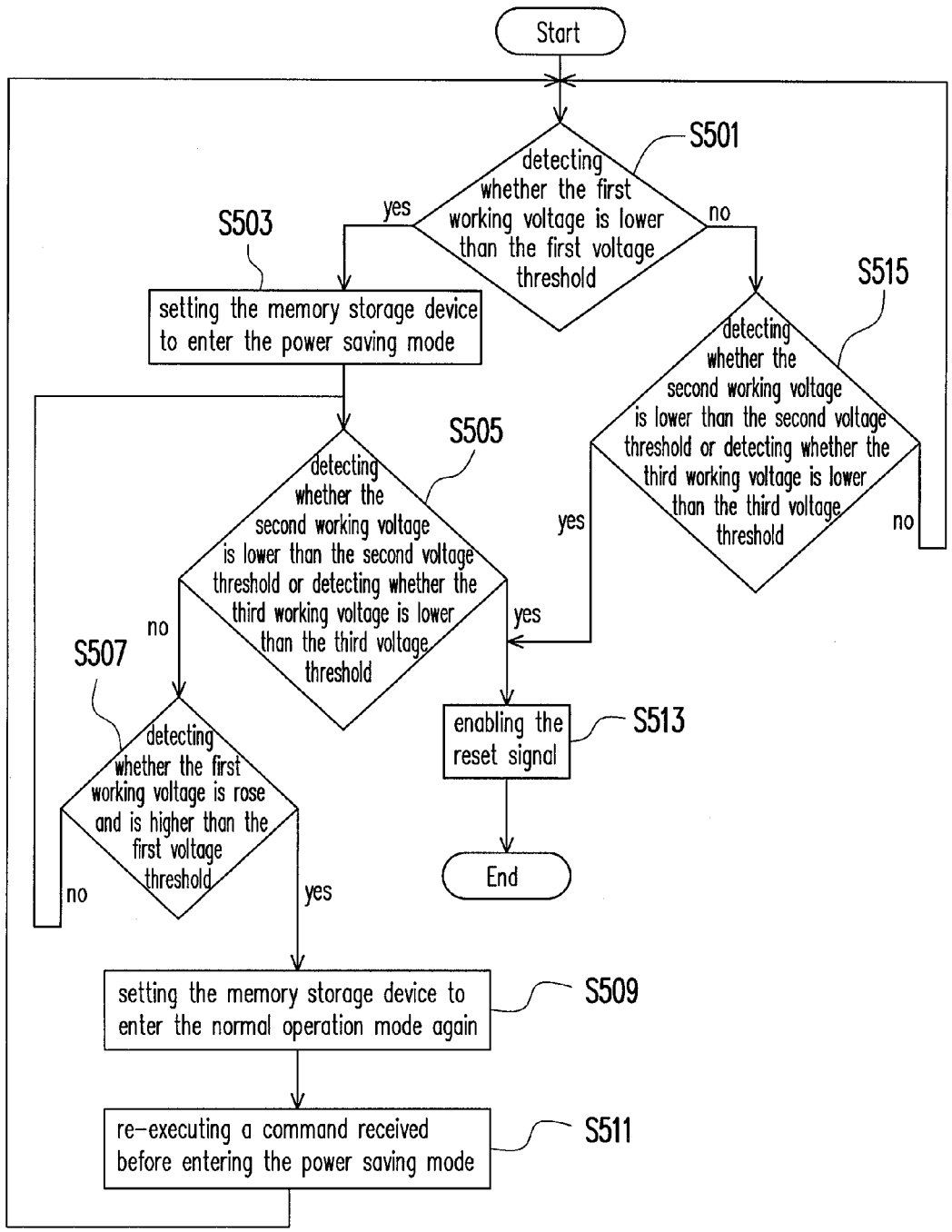
FIG. 5 is a flow chart illustrating the controlling method according to the first exemplary embodiment of the present invention.

FIG. 5 is a flow chart illustrating the controlling method according to the first exemplary embodiment of the present invention.

Referring to the FIG. 5, after the memory storage device 100 is activated, in step S501, whether the first working voltage is lower than the first voltage threshold is detected.

If the first working voltage is lower than the first voltage threshold, in step S503 the memory storage device 100 is set to enter the power saving mode. As mentioned before, in the power saving mode, the memory management circuit 142 of the memory controller 140 stops executing a command from the host system 1000 and stops giving a command to the rewritable non-volatile memory module 120.

Next, in the step S505, whether the second working voltage is lower than the second voltage threshold or whether the third working voltage is lower than the third voltage threshold is detected.

If the second working voltage is not lower than the second voltage threshold and the third working voltage is not lower than the third voltage threshold, in the step S507, whether the first working voltage is rose and is higher than the first voltage threshold is detected.

If the first working voltage is rose and is higher than the first voltage threshold, in the step S509, the memory storage device 100 is set to enter the normal operation mode again. Also, in the step S511, the rewritable non-volatile memory module 120 is set to be executed the command again which is received before entering the power saving mode. After the step S511, the step S501 is executed again for detecting the first working voltage. To be specific, in one exemplary embodiment, the re-executed command might be the command received but not start to execute, or received and executed but not finish the corresponding procedure, or not only received but executed the corresponding procedure completely before entering the power saving mode.

If the first working voltage is not rose and is lower than the first voltage threshold, the step S505 is executed for the following detection of the second working voltage and the third working voltage.

If the second working voltage is lower than the second voltage threshold or the third working voltage is lower than the third voltage threshold, in the step S513, the reset signal is enabled.

If the first working voltage is not lower than the first voltage threshold in the step S501, whether the second working voltage is lower than the second voltage threshold or whether the third working voltage is lower than the third voltage threshold is detected in the step S515.

If the second working voltage is not lower than the second voltage threshold and the third working voltage is not lower than the third voltage threshold, the step S501 is executed for detecting the first working voltage. If the second working voltage is lower than the second voltage threshold or the third working voltage is lower than the third voltage threshold, the step S513 is executed for resetting the memory storage device 100.

After the step S513, the flow shown in FIG. 5 is terminated, and when the memory storage device 100 is activated again, the step S510 is executed.

Second Exemplary Embodiment

The present exemplary embodiment is much alike the first exemplary embodiment, but the difference is that the voltage detection circuit 110 controls the memory storage device 100 according to the first working voltage and the circuit component working voltage.

Referring to the FIG. 2, the circuit component voltage detector 117 is used to detect whether the circuit component working voltage is lower than a circuit component voltage threshold. In the present exemplary embodiment, the circuit component working voltage is the third working voltage 113 used for operating the memory controller 140, and the circuit component voltage threshold is the above-mentioned third voltage threshold. When the circuit component working voltage is lower than the circuit component voltage threshold, the voltage detection circuit 110 enables the reset signal in order to stop receiving and executing commands from the host system 1000. When the first working voltage 111 is lower than the first voltage threshold, the voltage detection circuit 110 transmits the first signal to the memory controller 140, and the memory controller 140 enters the power saving mode in response to the first signal. The first signal and the power saving mode are illustrated above, so those are not repeated herein. On the other hand, in the power saving mode, the memory controller 140 stops executing a command from the host system 1000 and stops giving a command to the rewritable non-volatile memory module 120. When the circuit component working voltage is lower than the circuit component voltage threshold, the voltage detection circuit 110 enables the reset signal. Thus, the memory controller 140 can not receive and execute the command from the host system 1000. However, the detailed description of the reset signal, the memory controller 140, the rewritable non-volatile memory module 120 and the voltage detection circuit 110 are already illustrated above, so those are not repeated herein.

It should be understood that, even in the present exemplary embodiment, the circuit component working voltage is the third working voltage 113 used for operating the memory controller 140, and the circuit component voltage threshold is the above-mentioned third voltage threshold. However, in another exemplary embodiment, the circuit component working voltage may be the second working voltage 112 used for operating the buffer 130 and the circuit component voltage threshold is the above-mentioned second voltage threshold, so the present invention is not limited hereto.

Figure 6:
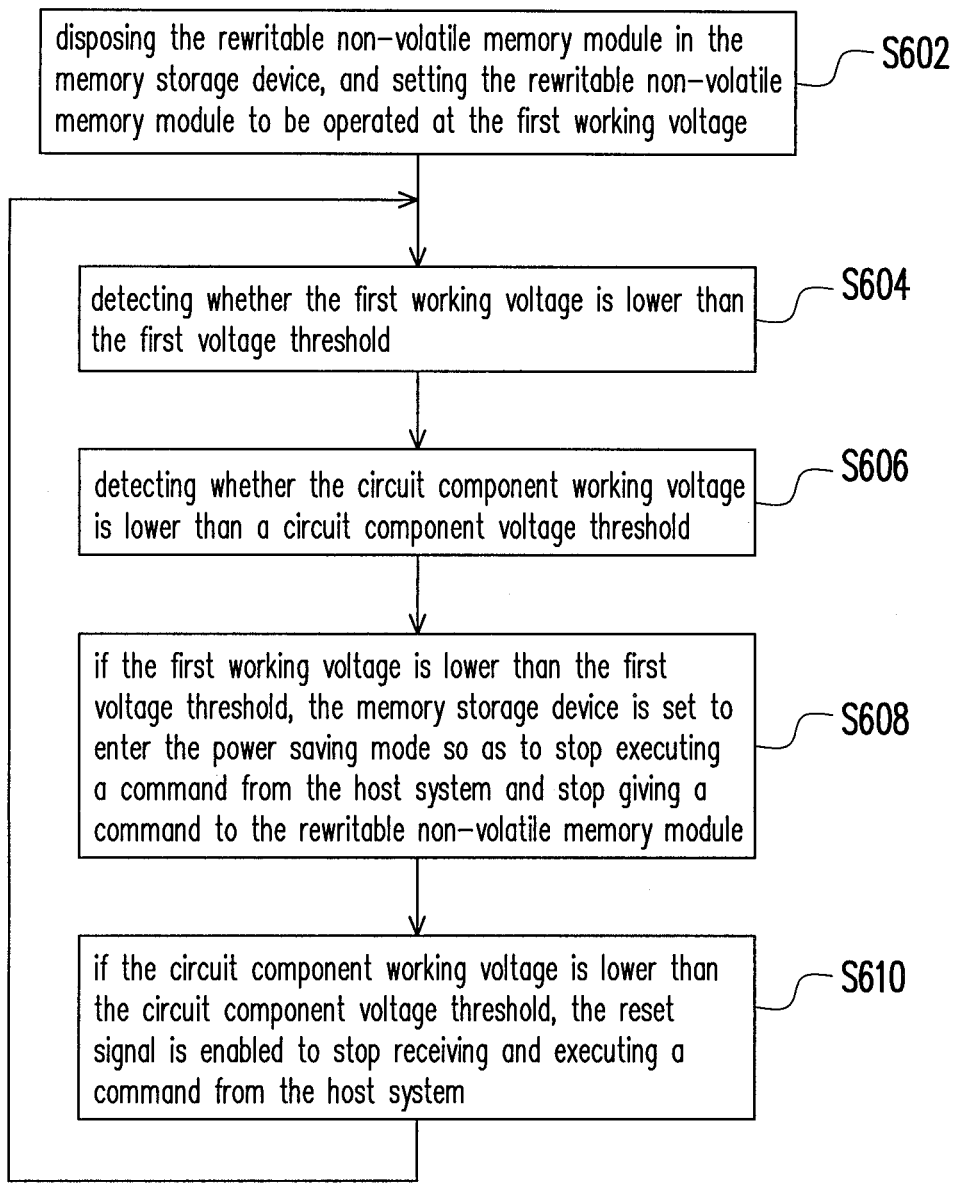
FIG. 6 is a flow chart illustrating the controlling method according to the second exemplary embodiment of the present invention.

FIG. 6 is a flowchart illustrating the controlling method according to the second embodiment of the present invention.

Referring to the FIG. 6, in the step S602, the rewritable non-volatile memory module is disposed in the memory storage device, and the rewritable non-volatile memory module is set to be operated at the first working voltage.

In the step S604, the first voltage detector 114 detects whether the first working voltage 111 is lower than the first voltage threshold.

In the step S606, the circuit component voltage detector 117 detects whether the circuit component working voltage is lower than a circuit component voltage threshold.

In the step S608, if the first working voltage 111 is lower than the first voltage threshold, the memory storage device 100 is set to enter the power saving mode so as to stop executing a command from the host system 1000 and stop giving a commands to the rewritable non-volatile memory module 120.

In the step S610, if the circuit component working voltage is lower than the circuit component voltage threshold, the voltage detection circuit 110 enables the reset signal in order to stop receiving and executing a command from the host system 1000.

It should be noted that, the FIG. 6 may include other sequences of steps, and the present invention is not limited hereto. For example, while executing the step S602, the step S606 can be executed before the step S604 and the step S610 can be executed before the S608, so the sequence of the execution is not limited by the steps illustrated in the FIG. 6 of the present invention. On the other hand, the step S604, S606, S608 and the S610 are executed repetitively in order to monitor the respective working voltages of the memory storage device 100 continuously.

In summary, the memory storage device, the memory controller, and the controlling method provided by the exemplary embodiments of the present invention can effectively avoid the data lost from the buffer caused by the unstable voltage. Additionally, if the first working voltage is lower than the first voltage threshold, the memory storage device enters the power saving mode and if the first working voltage is higher than the first voltage threshold, the memory storage device enters the normal operation mode, therefore the data in the buffer is stored without data lost and used for executing the command received before entering the power saving mode again when returning to the normal operation mode. Also, only if the circuit component working voltage is lower than the circuit component voltage threshold, the reset signal is enabled. In conclusion, by controlling the memory storage device based on different voltages, the stability of the memory storage device can be improved effectively according to the present invention. The previously described exemplary embodiments of the present invention have the advantages aforementioned, wherein the advantages aforementioned not required in all versions of the invention.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A memory storage device, comprising:
   a connector, configured to be coupled with a host system;
   a voltage detection circuit, having a first voltage detector and a circuit component voltage detector, wherein the first voltage detector is configured to detect whether a first working voltage is lower than a first voltage threshold and the circuit component voltage detector is configured to detect whether a circuit component working voltage is lower than a circuit component voltage threshold;
   a rewritable non-volatile memory module, coupled to the voltage detection circuit and operated at the first working voltage; and
   a memory controller, coupled to the voltage detection circuit,
   wherein if the first working voltage is lower than the first voltage threshold, the voltage detection circuit transmits a first signal to the memory controller, and the memory controller enters a power saving mode in response to the first signal,
   wherein the memory controller stops executing a command from the host system and stops giving a command to the rewritable non-volatile memory module in the power saving mode,
   wherein if the circuit component working voltage is lower than the circuit component voltage threshold, a reset signal is enabled by the voltage detection circuit,
   wherein the memory controller is unable to receive and execute a command from the host system when the reset signal is enabled.

2. The memory storage device according to claim 1, wherein the voltage detection circuit transmits a second signal to the memory controller when the first working voltage is higher than the first voltage threshold in the power saving mode,
   wherein the memory controller re-enters a normal operation mode in response to the second signal,
   wherein the memory controller is able to receive at least one command from the host system and accesses to the rewritable non-volatile memory module according to the at least one command in the normal operation mode.

3. The memory storage device according to the claim 2, wherein the memory controller re-executes a command received before entering the power saving mode to the rewritable non-volatile memory module after re-entering the normal operation mode.

4. The memory storage device according to the claim 3, wherein the re-executed command is a write command, and the memory controller select a physical block from the rewritable non-volatile memory module and writes data corresponding to the write command from a buffer into the physical block.

5. The memory storage device according to the claim 3, wherein the re-executed command is a read command, and the memory controller reads data corresponding to the read command again from the rewritable non-volatile memory module.

6. The memory storage device according to the claim 3, wherein the re-executed command is an erase command, and the memory controller gives the erase command to the rewritable non-volatile memory module again.

7. The memory storage device according to claim 1, further comprising:
a buffer, coupled to the voltage detection circuit,
wherein the circuit component voltage detector comprises a second voltage detector configured to detect whether a second working voltage is lower than a second voltage threshold, wherein the buffer is operated at the second working voltage, the circuit component working voltage is the second working voltage, and the circuit component voltage threshold is the second voltage threshold.

8. The memory storage device according to claim 1, wherein the circuit component voltage detector comprises a third voltage detector configured to detect whether a third working voltage is lower than a third voltage threshold, wherein the memory controller is operated at the third working voltage, the circuit component working voltage is the third working voltage, and the circuit component voltage threshold is the third voltage threshold.

9. The memory storage device according to claim 7, wherein the circuit component voltage detector further comprises a third voltage detector configured to detect whether a third working voltage is lower than a third voltage threshold, wherein the memory controller is operated at the third working voltage.

10. The memory storage device according to claim 9, wherein if the second working voltage is lower than the second voltage threshold or the third voltage threshold lower than the third voltage threshold, the reset signal is enabled by the voltage detection circuit.

11. The memory storage device according to claim 10, wherein the first voltage threshold is in a range of 3.3 volts to 2.1 volts, the second voltage threshold is in a range of 2.1 volts to 1.3 volts and the third voltage threshold is in a range of 1.3 volts to 0.5 volts.

12. A memory controller, for a memory storage device having a rewritable non-volatile memory module, the memory controller comprising:
a host interface, configured to be coupled with a host system;
a memory interface, configured to be coupled with the rewritable non-volatile memory module; and
a memory management circuit, coupled to the host interface and the memory interface, and configured to receive a first signal and enter a power saving mode in response to the first signal,
wherein the memory management circuit stops executing a command from the host system and stops giving a command to the rewritable non-volatile memory module in the power saving mode,
wherein the rewritable non-volatile memory module is operated at a first working voltage, and the first signal is transmitted to the memory management circuit when the first working voltage is lower than a first voltage threshold,
wherein the memory management circuit detects whether a reset signal is enabled, and the memory management circuit is unable to receive and execute a command from the host system when the reset signal is enabled,
wherein if a circuit component working voltage is lower than a circuit component voltage threshold, the reset signal is enabled.

13. The memory controller according to claim 12, wherein the memory management circuit is further configured to receive a second signal during the power saving mode,
wherein the memory management circuit re-enters a normal operation mode in response to the second signal,
wherein the second signal is transmitted to the memory management circuit when the first working voltage is higher than the first voltage threshold during the power saving mode,
wherein the memory management circuit is able to receives at least one command from the host system and accesses to the rewritable non-volatile memory module according to the at least one command in the normal operation mode.

14. The memory controller according to the claim 12, wherein the memory management circuit re-executes a command received before entering the power saving mode to the rewritable non-volatile memory module after re-entering the normal operation mode.

15. A controlling method for a memory storage device, comprising:
disposing a rewritable non-volatile memory module in the memory storage device, and setting the rewritable non-volatile memory module to be operated at a first working voltage;
detecting whether a first working voltage is lower than a first voltage threshold;
detecting whether a circuit component working voltage is lower than a circuit component voltage threshold;
setting the memory storage device to enter a power saving mode to stop executing a command from the host system and stop giving a command to the rewritable non-volatile memory module when the first working voltage is lower than the first voltage threshold; and
enabling a reset signal stop receiving and executing a command from the host system when the circuit component working voltage is lower than the circuit component voltage threshold.

16. The controlling method according to claim 15, further comprising:
setting the memory storage device to re-enter a normal operation mode to receive at least one command from the host system and access to the rewritable non-volatile memory module according to the at least one command when the first working voltage is higher than the first voltage threshold in the power saving mode.

17. The controlling method according to claim 16, further comprising:

re-executing a command received before entering the power saving mode to the rewritable non-volatile memory module after re-entering the normal operation mode.

18. The controlling method according to claim 17, wherein the re-executed is a write command,
wherein the step of re-executing the command received before entering the power saving mode to the rewritable non-volatile memory module comprising:
selecting a physical block from the rewritable non-volatile memory module and writing data corresponding to the write command into the physical block.

19. The controlling method according to claim 17, wherein the re-executed command is a read command,
wherein the step of re-executing the command received before entering the power saving mode to the rewritable non-volatile memory module comprising:
reading data corresponding to the read command from the rewritable non-volatile memory module again.

20. The controlling method according to claim 17, wherein the re-executed command is an erase command,
wherein the step of re-executing the command received before entering the power saving mode to the rewritable non-volatile memory module comprising:
giving the erase command to the rewritable non-volatile memory module again.

21. The controlling method according to claim 15, further comprising:
disposing a buffer in the memory storage device and setting the buffer to be operated at a second working voltage;
detecting whether the second working voltage is lower than a second voltage threshold; and
setting the circuit component working voltage as the second working voltage, wherein the circuit component voltage threshold as the second voltage threshold.

22. The controlling method according to claim 15, further comprising:
disposing a memory controller in the memory storage device and setting the memory controller to be operated at a third working voltage;
detecting whether the third working voltage is lower than a third voltage threshold; and
setting the circuit component working voltage as the third working voltage, wherein the circuit component voltage threshold as the third voltage threshold.

23. The controlling method according to claim 21, further comprising:
disposing a memory controller in the memory storage device and setting the memory controller to be operated at a third working voltage; and
detecting whether the third working voltage is lower than a third voltage threshold.

24. The controlling method according to claim 23, further comprising:
enabling the reset signal when the second working voltage is lower than the second voltage threshold or the third working voltage is lower than the third voltage threshold.

25. The controlling method according to claim 24, further comprising:
setting the first voltage threshold in a range of 3.3 volts to 2.1 volts;
setting the second voltage threshold in a range of 2.1 volts to 1.3; and
setting the third voltage threshold in a range of 1.3 volts to 0.5 volts.

* * * * *